(12) United States Patent
Ku et al.

(10) Patent No.: US 7,288,964 B2
(45) Date of Patent: Oct. 30, 2007

(54) VOLTAGE SELECTIVE CIRCUIT OF POWER SOURCE

(75) Inventors: Wei-Ming Ku, Taoyuan (TW); Hong-Ping Tsai, Hsinchu (TW)

(73) Assignee: Ememory Technology Inc., Hsinchu (TW)

( * ) Notice: Subject to any disclaimer, the term of this patent is extended or adjusted under 35 U.S.C. 154(b) by 142 days.

(21) Appl. No.: 11/202,894

(22) Filed: Aug. 12, 2005

(65) Prior Publication Data

US 2007/0035181 A1   Feb. 15, 2007

(51) Int. Cl.
*H03K 19/0175* (2006.01)

(52) U.S. Cl. .............................. 326/81; 326/68; 326/80

(58) Field of Classification Search .................. 326/33, 326/68, 80–81; 327/530, 537, 534
See application file for complete search history.

(56) References Cited

U.S. PATENT DOCUMENTS 6,774,704 B2 * 8/2004 Kushnarenko .............. 327/530

2004/0070441 A1 * 4/2004 Bringivijayaraghavan .. 327/534

* cited by examiner

*Primary Examiner*—Anh Q. Tran
(74) *Attorney, Agent, or Firm*—William E. Pelton, Esq.; Cooper & Dunham LLP

(57) ABSTRACT

A voltage selective circuit of a power source having a first voltage and a second voltage of the present invention includes a selective switch module, a high voltage bias module, a level shift module and a high voltage selective module. The selective switch module includes two first transistors. A power supply is selected from either the first voltage or the second voltage to output to integrated circuits. The high voltage bias module selects a higher voltage from the power supply and the power source of the first/second voltage to output to wells of the two first transistors. The level shift module includes two level shifters. The high voltage selective module selects a higher voltage from the first voltage and the second voltage as internal power to supply to the level shift module.

14 Claims, 4 Drawing Sheets

VOLTAGE SELECTIVE CIRCUIT OF POWER SOURCE

BACKGROUND OF THE INVENTION

1. Field of the Invention

The invention relates in general to a voltage selective circuit of a power source having a first voltage and a second voltage, and more particularly to a power source for operating power of an integrated circuit, wherein a power selective circuit of the power supply can prevent junction leakage and also avoid generating a body effect, so as to ensure a drive capability of a transistor in a circuit.

2. Description of the Related Art

Some specific integrated circuits such as a flash memory require power supplies with different voltage levels to enable different operation modes such as to write/erase. Because these actions are achieved based on different supply voltages, a power supply must be able to selectively output different voltages. In order to achieve the aforesaid requirement, the power supply of the integrated circuits is configured with a power selective circuit. Referring to FIG. 4, a detailed circuit diagram of a conventional power selective circuit is shown. The power selective circuit includes a selective switch module 70, which is made up of two P-type MOS transistors 71 and 72. Two sources of the two P-type MOS transistors 71 and 72 are respectively connected to a first voltage VDD and a second voltage VPP. Two drains of the two P-type MOS transistors 71 and 72 are connected to each other to make up a power output terminal VPPIN.

A level shift module 80 is made up by two level shifters 81 and 82. The level shift module 80 is used for a group of lower level control signals ENVDD and ENVPP to be transformed to the control signals ENVDDHV and ENVPPHV with higher level values. Two control signal output terminals ENVDDHV and ENVPPHV of the two level shifters 81 and 82 are connected to the gate of the two P-type MOS transistors 71 and 72.

Generally speaking, the second voltage VPP of the power selective circuit is stepped up by a charge pump, so as to have a higher voltage. The first voltage VDD has a lower level voltage than the second voltage VPP. The selective switch module 70 selects to output the first voltage VDD or the second voltage VPP to the integrated circuit according to conducting conditions of the P-type MOS transistors 71 and 72. Thereby the demand for different operation modes can be provided. Therefore the voltage VDD of the power output terminal VPPIN is supplied to the integrated circuit when the P-type MOS transistor 71 is conductive. On the contrary, the voltage VPP of the power output terminal VPPIN is supplied to the integrated circuit when the P-type MOS transistor 72 is conductive.

However, the aforesaid power selective circuit generates a body effect when in an actual operation and results in an impaired drive capability problem. As described above, the selective switch module 70 is made up of two P-type MOS transistors 71 and 72. In order to avoid PN junction leakage when the two P-type MOS transistors 71 and 72 switch to output the voltage VDD or VPP, an N-well for the two P-type MOS transistors 71 and 72 should be biased up to a ceiling voltage. A conventional layout for the power selective circuit is to provide a floating N-well by making the junctions of the N-well, the source and the drain conductive to bias the N-well up to the ceiling voltage, and then the N-well is isolated to prevent the PN junction leakage. In such a condition, when the selective switch module 70 switches to the P-type MOS transistor 72 to be conductive to output the voltage VPP of the output terminal VPPIN and supply to the integrated circuit, the PN junction is thus conductive, so that the N-well gets charged. When the N-well is charged to an electric potential smaller than the VPP for a threshold voltage, the N-well is isolated. When the selective switch module 70 switches back to the P-type MOS transistor 71 to be conductive to output the voltage VDD of the output terminal VPPIN, because the N-well is isolated with the high electric potential, the P-type MOS transistor 71 thus generates the body effect and further impairs the drive capability of the P-type MOS transistor 71.

SUMMARY OF THE INVENTION

It is therefore an objective of the present invention to provide a voltage selective circuit of power source having a first voltage and a second voltage to effectively avoid the body effect and to ensure the drive capability of the transistors.

The voltage selective circuit of power source having a first voltage and a second voltage of the present invention mainly includes a selective switch module, a high voltage bias module, a level shift module and a high voltage selective module. The selective switch module includes two first transistors and the selective switch module is controlled by a control signal set. A power supply is selected from either the first voltage or the second voltage for outputting to integrated circuits. The high voltage bias module selects a higher voltage from the power supply and the power source of the first voltage and the second voltage to output to wells of the two first transistors of the selective switch module. The level shift module includes two level shifters for shifting the control signal set from a lower level control signal set to a higher level control signal set, so as to control switch operations of the selective switch module. The high voltage selective module selects a higher voltage from the first voltage and the second voltage as an internal power to supply to the level shift module.

Before the integrated circuit executes a write action, the first voltage of the power supply is switched on and the second voltage VPP is switched off. The second voltage does not step up, so that the voltage of the output terminal of power supply of the selective switch module is the first voltage, which indicates that the original voltage of the N-type wells of the two first transistors of the selective switch module is actually the first voltage. When the integrated circuit executes the write action, the first voltage is switched off and the second voltage is switched on. The second voltage is stepped up by the charge pump, so that the second voltage is higher than the first voltage. The selective switch module then selects the second voltage as the power supply to output to the integrated circuits for the integrated circuits to execute the write action. At this moment, the high voltage bias module selects the higher voltage between internal power and the output voltage to output the selected voltage to the N-type wells of the first transistors of the selective switch module. Thereby the N-type wells of first transistors can be biased up to the highest electric potential, so as to prevent the PN junction leakage. However, the N-type wells of the first transistors do not always hold the highest electric potential. When the integrated circuit completes the write action, the second voltage is switched off, so that the voltage recovers to a standard value such as the first voltage~0V. The first voltage is switched on, then the output power supply of the selective switch module switches from the second voltage to the first voltage, and the well bias power outputted by the high voltage bias module also recovers to the first voltage. Hence the N-type wells of the first transistors also recover to the original voltage. In this way, the body effect can be effectively avoided, so as to ensure the drive capability of the first transistors.

DETAILED DESCRIPTION OF THE INVENTION

Figure 1:
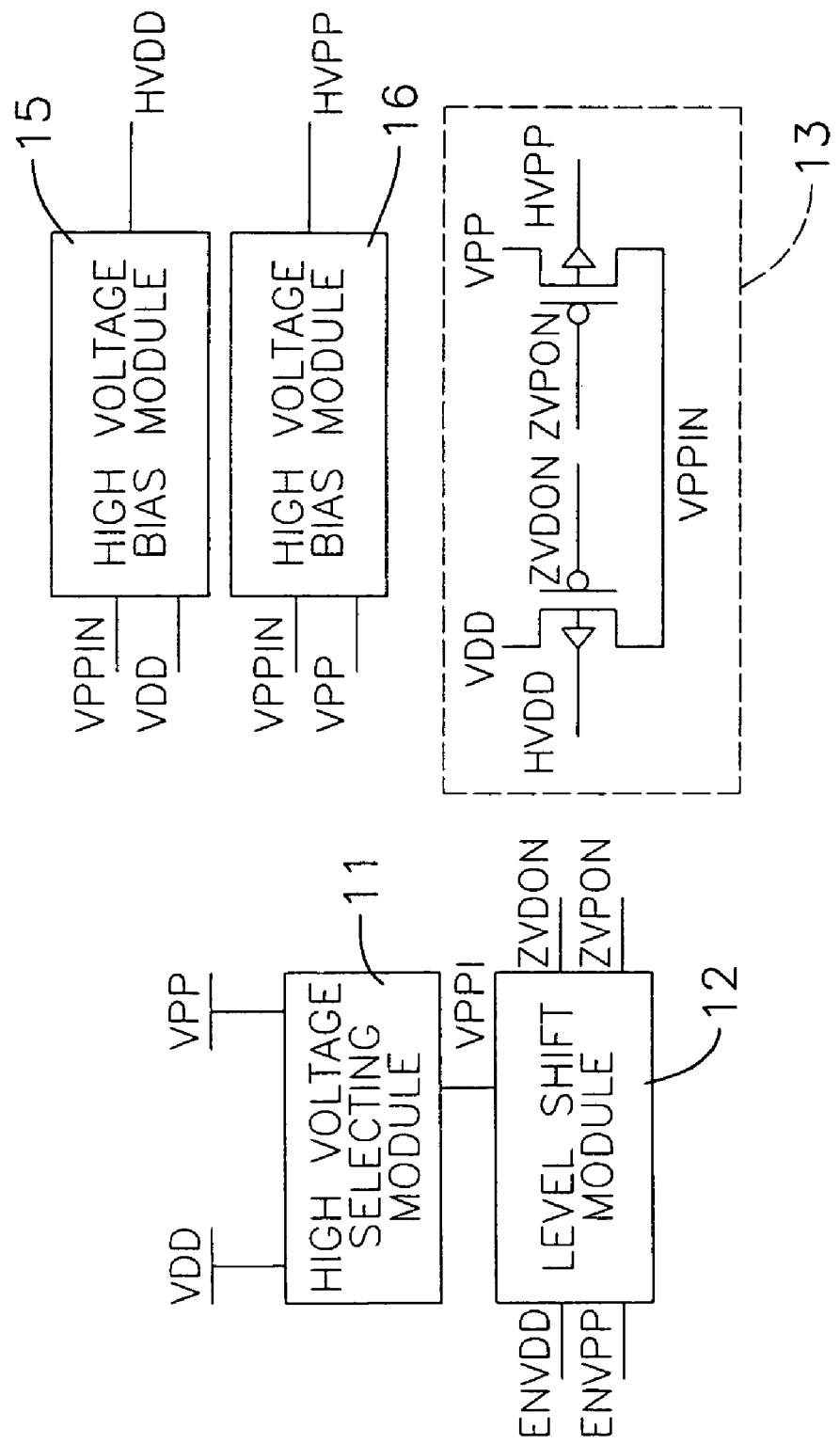
FIG. 1 shows a circuit block diagram of an example of a first preferred embodiment of the present invention.

Referring to FIG. 1, a circuit block diagram of an example of a first preferred embodiment of the present invention is shown. A high voltage selective module 11 selects a higher voltage from a first voltage VDD and a second voltage VPP as an internal power VPPI. In this preferred embodiment, the second voltage VPP is stepped up by the charge pump to have higher voltage. The first voltage VDD has a lower level voltage than the second voltage VPP.

The high voltage selective module 1 supplies power to a level shift module 12 for shifting a lower level control signal set ENVDD and ENVPP to a higher level control signal set ZVDON and ZVPON. A selective switch module 13 includes two transistors 131 and 132, and the selective switch module 13 is controlled by the control signal set ZVDON and ZVPON. Either the first voltage VDD or the second voltage VPP is selected for outputting to integrated circuits.

Two high voltage bias modules 15 and 16 respectively switch between an output voltage VPPIN of the selective switch module 13 and the first voltage VDD or the second voltage VPP. The high voltage bias module 15 selects a voltage between the output voltage VPPIN of the selective switch module 13 and the first voltage VDD to output the selected voltage to an N-type well of the transistor 131 of the selective switch module 13. The other high voltage bias module 16 selects a voltage between the output voltage VPPIN of the selective switch module 13 and the first voltage VPP to output the selected voltage to the other N-type well of the other transistor 132 of the selective switch module 13.

Figure 2:
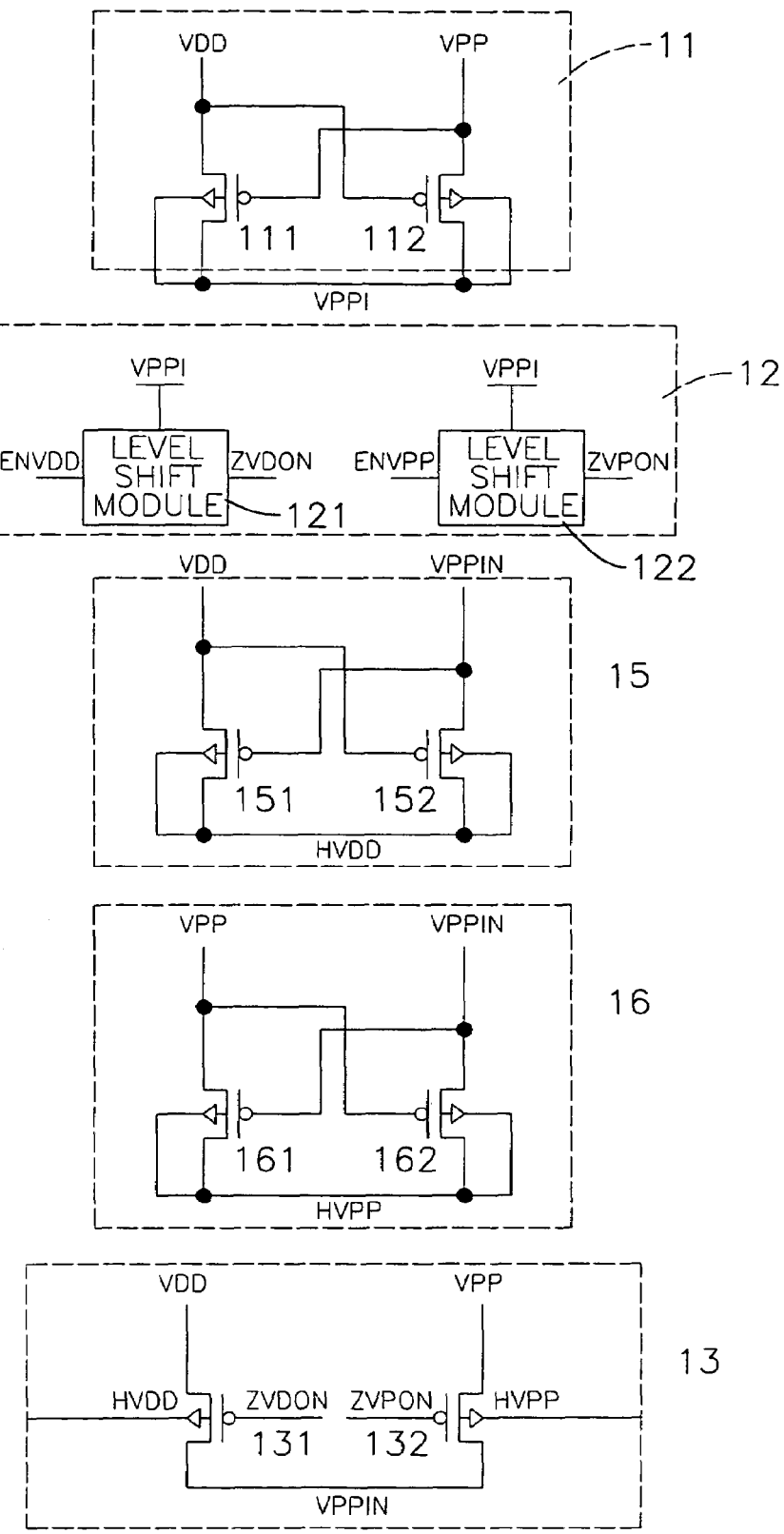
FIG. 2 shows a detailed circuit diagram of an example of the first preferred embodiment of the present invention.

Referring to FIG. 2, a detailed circuit diagram of an example of the first preferred embodiment of the present invention is shown. The high voltage selective module 11 includes two P-type transistors 111 and 112. Each source of the two P-type transistors 111 and 112 is connected to the first voltage VDD and the second voltage VPP respectively. Drains of the two P-type transistors 111 and 112 are connected to their N-type wells and also connected together to form an internal power output terminal VPPI. A gate of the two P-type transistors 11 and 112 is cross-connected to the source of the other P-type transistor, so as to connect to the second voltage VPP and the first voltage VDD. By switching the two P-type transistors 111 and 112, a higher voltage is selected from the first voltage VDD and the second voltage VPP as the internal power VPPI. Since the second voltage VPP is stepped up by the charge pump to have the higher voltage, the second voltage VPP is selected as the internal power VPPI.

The level shift module 12 includes two level shifters 121 and 122. Each of the two level shifters 121 and 122 includes an input terminal to receive the lower level control signal set ENVDD and ENVPP. Each of the two level shifters 121 and 122 includes an output terminal to output the higher level control signal set ZVDON and ZVPON.

The two transistors 131 and 132 of the selective switch module 13 are P-type transistors. Each source of the two P-type transistors 131 and 132 is connected to the first voltage VDD and the second voltage VPP respectively. Drains of the two P-type transistors 131 and 132 are connected together to form an output terminal VPPIN of power supply for outputting to the integrated circuits (not shown in the diagram). The two transistors 131 and 132 are respectively connected to output terminals of the control signal set of the two level shifters 121 and 122 of the level shift module 12, so as to be controlled by the output control signal set ZVDON and ZVPON. Thereby one of the first voltage VDD and the second voltage VPP is selected to output to the integrated circuits.

The two high voltage bias modules 15 and 16 are respectively made up of two P-type transistors 151, 152 and 161, 162. In this preferred embodiment, the circuit structure of the high voltage bias modules 15 and 16 is similar to the high voltage selective module 11. Each source of the two P-type transistors 151 and 152 of the high voltage bias module 15 is connected to the first voltage VDD and the output terminal VPPIN of the power supply of the selective switch module 13 respectively. Drains of the two P-type transistors 151 and 152 are connected to their N-type wells and also connected together to form a well bias power output terminal HVDD. Moreover, a gate of the two P-type transistors 151 and 152 is cross-connected to the source of the other P-type transistor, so as to connect to the output terminal VPPIN of the power supply of the selective switch module 13 and the first voltage VDD. By switching the two P-type transistors 151 and 152, a higher voltage is selected from the VPPIN of power supply and the first voltage VDD as a well bias power HVDD.

Each source of the two P-type transistors 161 and 162 of the high voltage bias module 16 is connected to the second voltage VPP and the output terminal VPPIN of power supply of the selective switch module 13 respectively. Drains of the two P-type transistors 161 and 162 are connected to their N-wells and also connected together to form a well bias power output terminal HVPP. Moreover, a gate of the two P-type transistors 161 and 162 is cross-connected to the source of the other P-type transistor, so as to connect to the output terminal VPPIN of power supply of the selective switch module 13 and the second voltage VPP. By switching the two P-type transistors 161 and 162, a higher voltage is selected from the VPPIN of power supply and the second voltage VPP as a well bias power HVPP.

Therefore, according to the above-described example of the first preferred embodiment of the present invention, the selective switch module 13 selects a higher voltage as the power supply VPPIN for the integrated circuit. When the integrated circuit operates in a particular operation mode, the two high voltage bias modules 15 and 16 respectively provide the well bias power HVDD and HVPP to the N-type wells of the two transistors 131 and 132 of the selective switch module 13. Thereby the N-type wells of the transistors 131 and 132 always can hold the highest electric potential, greater than both the source and drain or equal to both the source and drain, so as to prevent the PN junction leakage. After the integrated circuit completes the operation, the N-type wells of the transistors 131 and 132 still can be switched back to the original electric potential of the source. In this way, the body effect can be effectively avoided, so as to ensure the drive capability of the transistors 131 and 132.

Figure 3:
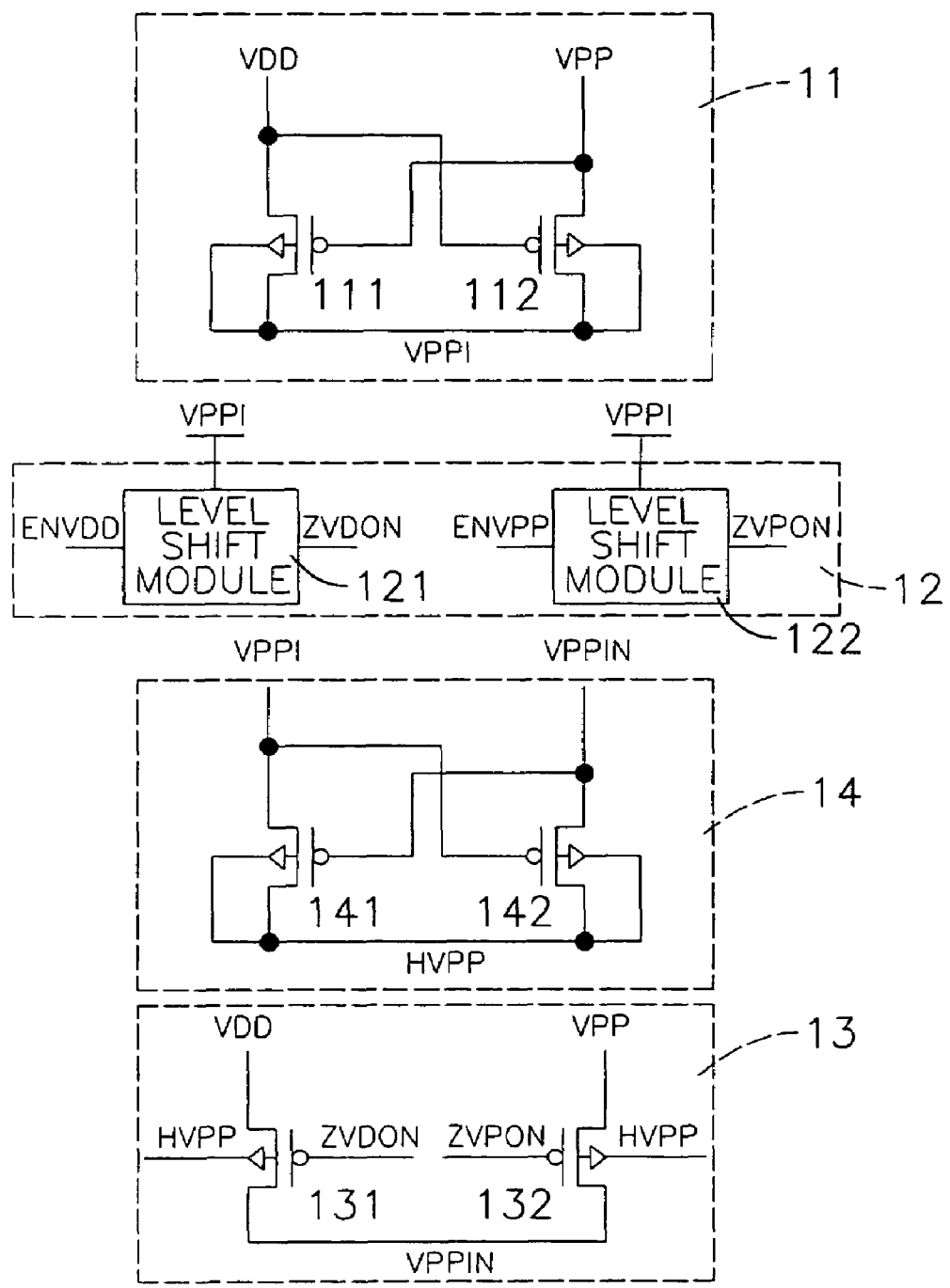
FIG. 3 shows a detailed circuit diagram of an example of a second preferred embodiment of the present invention.
Figure 4:
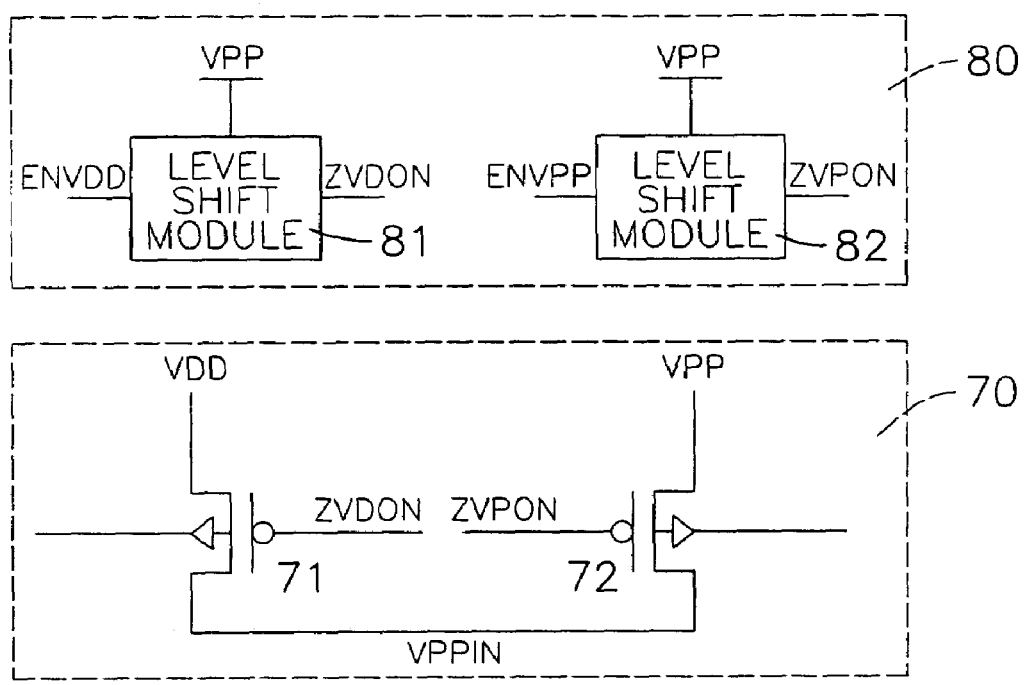
FIG. 4 shows a circuit diagram of a conventional power selective circuit.

Referring to FIG. 3, a detailed circuit diagram of an example of a second preferred embodiment of the present invention is shown. A high voltage selective module 11 selects a higher voltage from a first voltage VDD and a second voltage VPP as the internal power VPPI. In this preferred embodiment, the second voltage VPP is stepped up by the charge pump to have higher voltage. The first voltage VDD has a lower level voltage than the second voltage VPP.

The high voltage selective module 11 supplies power to a level shift module 12 for shifting a lower level control signal set ENVDD and ENVPP to a higher level control signal set ZVDON and ZVPON. A selective switch module 13 includes two transistors 131 and 132, and is controlled by the control signal set ZVDON and ZVPON. One of the first voltage VDD and the second voltage VPP is selected to output the selected voltage to integrated circuits.

A high voltage bias module 14 switches between the internal power VPPI and an output voltage VPPIN of the selective switch module 13 to select one of the voltages to output to N-type wells of the transistors 131 and 132 of the selective switch module 13.

In comparison with the first preferred embodiment of the present invention, the high voltage selective module 11, the level shift module 12 and the selective switch module 13 of the second preferred embodiment are identical to those of the first preferred embodiment. Moreover, the high voltage bias module 14 of the second preferred embodiment is also identical to the high voltage bias module 15, 16 of the first preferred embodiment. The difference is as follows. The high voltage bias module 14 is made up of two P-type transistors 141 and 142. Each source of the two P-type transistors 141 and 142 is connected to the internal power VPPI and an output voltage VPPIN of the selective switch module 13 respectively. Drains of the transistors 141 and 142 are connected to their N-type wells and also connected together to from a well bias power output terminal HVPP.

Moreover, a gate of the two P-type transistors 141 and 142 is cross-connected to the source of the other P-type transistor, so as to connect to the output terminal VPPIN of a power supply of the selective switch module 13 and the internal power VPPI. By switching the two P-type transistors 141 and 142, a higher voltage is selected from the VPPIN of power supply and the internal power VPPI as a well bias power HVPP.

Concerning the operation mode as described in the first preferred embodiment, before the integrated circuit executes a write action, the first voltage VDD of the power supply is switched on and the second voltage VPP is switched off. The second voltage VPP does not step up, so that the voltage of the output terminal VPPIN of power supply of the selective switch module 13 is VDD, which indicates that the original voltage of the N-type wells of the transistor 131 and 132 of the selective switch module 13 is actually VDD. When the integrated circuit executes the write action, the first voltage VDD is switched off and the second voltage VPP is switched on. The second voltage VPP is stepped up by the charge pump, so that VPP is higher than the VDD. The selective switch module 13 then selects the second voltage VPP as power supply VPPIN to output to the integrated circuits for the integrated circuits to execute the write action. At this moment, the high voltage bias module 14 selects the higher voltage between the internal power VPPI and the output voltage VPPIN as HVPP to output to the N-type wells of the transistors 131 and 132 of the selective switch module 13. Thereby the N-type wells of transistors 131 and 132 can be biased up to the highest electric potential, so as to prevent the PN junction leakage. However, the N-type wells of the transistors 131 and 132 do not always hold the highest electric potential. When the integrated circuit completes the write action, the second voltage VPP is switched off, so that the voltage recovers to a standard value such as the VDD~0V. The first voltage VDD is switched on, then the output power supply VPPIN of the selective switch module 13 switches from the VPP to VDD, and the well bias power HVPP outputted by the high voltage bias module 14 also recovers to the VDD. Hence the N-type wells of the transistors 131 and 132 also recover to the original voltage. In this way, the body effect can be effectively avoided, so as to ensure the drive capability of the transistors 131 and 132.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A voltage selective circuit of a power source having a first voltage and a second voltage, the voltage selective circuit comprising:
    a high voltage selective module selecting a higher voltage from either the first voltage or the second voltage as an internal power;
    a level shift module receiving the internal power and comprising two level shifters for shifting a control signal set from a lower level control signal set to a higher level control signal set;
    a selective switch module comprising two first transistors being controlled by the higher level control signal set and selecting either the first voltage or the second voltage as a power supply for outputting to integrated circuits;
    a high voltage bias module selecting a higher voltage from either the power supply or the internal power to output to wells of the two first transistors.

2. The voltage selective circuit of the power source having the first voltage and the second voltage as claimed in claim 1, wherein the two first transistors of the selective switch module are respectively connected to the control signal set by a gate, wherein each of the two first transistors comprises a first terminal and a second terminal;
    wherein the two first terminals are connected to the first voltage and the second voltage respectively, and the two second terminals are connected together to form an power supply terminal; and wherein the wells of the two first transistors are respectively connected to an output terminal of the high voltage bias module.

3. The voltage selective circuit of the power source having the first voltage and the second voltage as claimed in claim 1, wherein the high voltage bias module comprises two second transistors, each of the two second transistors comprising a first terminal, a second terminal and a well;
    wherein the two first terminals are respectively connected to the power supply terminal of the selective switch module and an internal power;
    wherein the second terminals of the second transistors are connected to their wells and also connected together to form a well bias power output terminal to be connected to the wells of the first transistors of the selective switch module; and wherein a gate of the two second transistors is cross-connected to the first terminals of the second transistors.

4. The voltage selective circuit of the power source having the first voltage and the second voltage as claimed in claim 2, wherein the two first transistors of the selective switch module are P-type MOS transistors, wherein the first terminal of each first transistor is a source and the second terminal of each first transistor is a drain.

5. The voltage selective circuit of the power source having the first voltage and the second voltage as claimed in claim 2, wherein the two second transistors of the high voltage bias module are P-type MOS transistors, wherein the first terminal of each second transistor is a source and the second terminal of each second transistor is a drain.

6. The voltage selective circuit of the power source having the first voltage and the second voltage as claimed in claim 1, wherein the high voltage selective module comprises two third transistors, each of the two third transistors comprises a first terminal, a second terminal and a gate, the two first terminals respectively connected to the first voltage and the second voltage; the two second terminals connected to the wells and also connected together to form the internal power output terminal; and the gates of the two third transistors cross-connected to the first terminals of the two third transistors.

7. The voltage selective circuit of the power source having the first voltage and the second voltage as claimed in claim 6, wherein the two third transistors of the high voltage selective module are P-type MOS transistors, and the first terminal of each third transistor is a source and the second terminal of each third transistor is a drain.

8. A voltage selective circuit of a power source having a first voltage and a second voltage, the voltage selective circuit comprising:
   a high voltage selective module selecting a higher voltage from either the first voltage and the second voltage as an internal power;
   a level shift module receiving the internal power and comprising two level shifters for shifting a control signal set from a lower level control signal set to a higher level control signal set;
   a selective switch module comprising two first transistors being controlled by the higher level control signal set, and selecting either the first voltage or the second voltage as a power supply for outputting to integrated circuits;
   a first high voltage bias module selecting a higher voltage from either the power supply or the first voltage to output to a well of the two first transistors of the selective switch module; and
   a second high voltage bias module selecting a higher voltage from either the power supply or the second voltage to output to the other well of the two first transistors of the selective switch module.

9. The voltage selective circuit of the power source having the first voltage and the second voltage as claimed in claim 8, wherein the two first transistors of the selective switch module are respectively connected to the control signal set by a gate, wherein each of the two first transistors comprises a first terminal and a second terminal; wherein the two first terminals are connected to the first voltage and the second voltage respectively, and the two second terminals are connected together to form an power supply terminal; and wherein the wells of the two transistors are respectively connected to output terminals of the high voltage bias modules.

10. The voltage selective circuit of the power source having the first voltage and the second voltage as claimed in claim 8, wherein the first/second high voltage bias modules respectively comprise two second transistors, wherein each of the two second transistors comprises a first terminal, a second terminal and a gate, wherein the gate of each second transistor is cross-connected to the first terminal of the other second transistor, wherein
   the first terminals of the two second transistors of the first high voltage bias module are respectively connected to the output terminal of power supply of the selective switch module and the first voltage; wherein the second terminals are connected to their wells and also connected together to form a first well bias power output terminal; and wherein
   the first terminals of the two second transistors of the second high voltage bias module are respectively connected to the output terminal of a power supply of the selective switch module and the second voltage; wherein the second terminals are connected to their wells and also connected together to form a second well bias power output terminal.

11. The voltage selective circuit of the power source having the first voltage and the second voltage as claimed in claim 9, wherein the two first transistors of the selective switch module are P-type MOS transistors, wherein the first terminal of each first transistor is a source and the second terminal of each first transistor is a drain.

12. The voltage selective circuit of the power source having the first voltage and the second voltage as claimed in claim 10, wherein the two second transistors of the first/second high voltage bias module are P-type MOS transistors, wherein the first terminal of each second transistor is a source and the second terminal of each second transistor is a drain.

13. The voltage selective circuit of the power source having the first voltage and the second voltage as claimed in claim 8, wherein the high voltage selective module comprises two third transistors, wherein each of the two transistors comprises a first terminal, a second terminal and a gate, the two first terminals respectively connected to the first voltage and the second voltage; the two second terminals connected to the wells and also connected together to form an internal power output terminal; and the gates of the two third transistors cross-connected to the first terminals of the two third transistors.

14. The voltage selective circuit of the power source having the first voltage and the second voltage as claimed in claim 13, wherein the two third transistors of the high voltage selective module are P-type MOS transistors, wherein the first terminal of each third transistor is a source and the second terminal of each third transistor is a drain.

* * * * *